United States Patent
Lai

(10) Patent No.: US 10,748,636 B2
(45) Date of Patent: Aug. 18, 2020

(54) TESTING SYSTEM AND ADAPTIVE METHOD OF GENERATING TEST PROGRAM

(71) Applicant: Winbond Electronics Corp., Taichung (TW)

(72) Inventor: Chih-Chiang Lai, Hsinchu (TW)

(73) Assignee: WINBOND ELECTRONICS CORP., Taichung (TW)

( * ) Notice: Subject to any disclaimer, the term of this patent is extended or adjusted under 35 U.S.C. 154(b) by 44 days.

(21) Appl. No.: 16/120,864

(22) Filed: Sep. 4, 2018

(65) Prior Publication Data

US 2020/0075117 A1    Mar. 5, 2020

(51) Int. Cl.

| | |
|---|---|
| G11C 29/36 | (2006.01) |
| G06N 3/08 | (2006.01) |
| G11C 29/44 | (2006.01) |
| G11C 29/38 | (2006.01) |

(52) U.S. Cl.
CPC .............. *G11C 29/36* (2013.01); *G06N 3/08* (2013.01); *G11C 29/38* (2013.01); *G11C 29/44* (2013.01)

(58) Field of Classification Search
CPC .................................................. G11C 29/36
USPC ........................................ 714/718, 720, 723
See application file for complete search history.

(56) References Cited

U.S. PATENT DOCUMENTS

| | | | |
|---|---|---|---|
| 5,787,190 A | 7/1998 | Peng et al. | |
| 6,526,545 B1 | 2/2003 | Lin et al. | |
| 7,493,185 B2 | 2/2009 | Cheng et al. | |
| 2007/0022323 A1* | 1/2007 | Loh .................. | G01R 31/31705 714/38.14 |
| 2008/0270854 A1 | 10/2008 | Kopel | |
| 2010/0223035 A1* | 9/2010 | Weyh .................. | G01R 31/2846 703/2 |
| 2015/0067422 A1* | 3/2015 | Hamilton ................ | G06F 11/24 714/724 |
| 2016/0197684 A1* | 7/2016 | Tsai .................... | H04B 17/0085 455/67.14 |
| 2016/0197685 A1* | 7/2016 | Tsai .................... | H04B 17/0085 370/242 |
| 2018/0342050 A1* | 11/2018 | Fitzgerald ................ | H04N 7/18 |

OTHER PUBLICATIONS

Taiwanese Office Action and Search Report based on corresponding Application No. 107123472; dated Oct. 30, 2019.

* cited by examiner

*Primary Examiner* — Fritz Alphonse

(74) *Attorney, Agent, or Firm* — Muncy, Geissler, Olds & Lowe, P.C.

(57) ABSTRACT

A testing system is provided. The testing system includes: test equipment and a testing-control apparatus. The test equipment is configured to perform tests on a device under test. The testing-control apparatus is configured to execute a test program to control the test equipment to perform a plurality of first test items in the test program on the device under test. The testing-control apparatus retrieves a test result of each of the first test items from the test equipment, and executes a test-program neural network to analyze the test result of each of the first test items to generate the test program for a next test iteration.

20 Claims, 7 Drawing Sheets

TESTING SYSTEM AND ADAPTIVE METHOD OF GENERATING TEST PROGRAM

BACKGROUND OF THE INVENTION

Field of the Invention

The present invention relates to a testing apparatus and, in particular, to a testing system and an adaptive method of generating a test program.

Description of the Related Art

In manufacturing computer memory, the test program of a memory device has designs, features, conditions and test patterns that can be adjusted manually and updated with different test phases to achieve the appropriate test coverage within a reasonable test time. This is due to different manufacturing procedures being employed. However, the memory-testing procedure usually requires a lot of human resources, and testing machines can be costly, and it cannot solve the problem of quality loss and low yield due to variations in manufacturing processes.

BRIEF SUMMARY OF THE INVENTION

A detailed description is given in the following embodiments with reference to the accompanying drawings.

In an exemplary embodiment, a testing system is provided. The testing system includes: test equipment and a testing-control apparatus. The test equipment is configured to perform tests on a device under test. The testing-control apparatus is configured to execute a test program to control the test equipment to perform a plurality of first test items in the test program on the device under test. The testing-control apparatus retrieves a test result of each of the first test items from the test equipment, and executes a test-program neural network to analyze the test result of each of the first test items to generate the test program for a next test iteration.

In another exemplary embodiment, an adaptive method of generating a test program for use in a testing system is provided. The testing system comprises test equipment for performing tests on a device under test, the adaptive method includes the steps of: executing a test program to control the test equipment to perform a plurality of first test items in the test program on the device under test; retrieving a test result of each of the first test items from the test equipment; and executing a test-program neural network to analyze the test result of each of the first test items to generate the test program for a next test iteration.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 1:
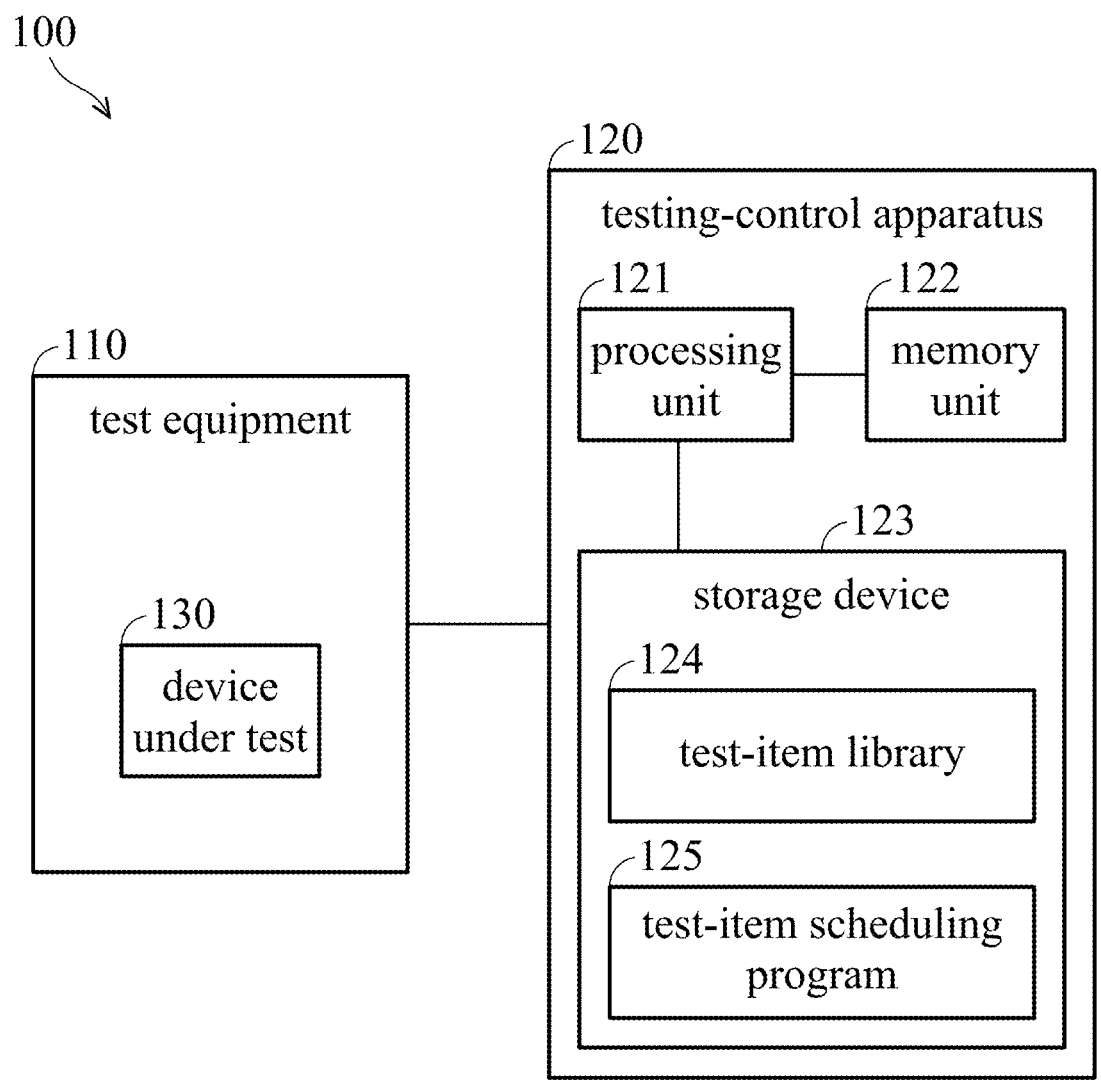
FIG. 1 is a block diagram of a testing system in accordance with an embodiment of the invention.

FIG. 1 is a block diagram of a testing system in accordance with an embodiment of the invention. In an embodiment, the testing system 100 includes test equipment 110 and a testing-control apparatus 120. The test equipment 110 is configured to perform a series of different test items on one or more devices under test (DUTs) 130 to obtain a test result of each test item of the DUT 130. The test equipment 110 may be automatic test equipment (ATE) that may test the one or more DUTs 130 with different test items using hardware, software, or a combination thereof.

In an embodiment, the DUT 130 may be a memory chip such as a dynamic random-access memory (DRAM) chip or a flash memory chip, but the invention is not limited thereto. In another embodiment, the DUT 130 may be a semiconductor wafer that is divided into a plurality of dies, and each die may include an integrated circuit.

For example, the test items of a DRAM chip may include: DC parametric testing, AC parametric testing, functional tests, dynamic tests, stuck-at fault (SAF), transition faults, coupling faults, neighborhood-pattern-sensitive faults, address-decoder faults (AF), retention faults, write recovery time (TWR) faults, gate-induced drain-leakage (GIDL) faults, and asymmetric-array-noise (AAN) fault, but the invention is not limited thereto. One having ordinary skill in the art will appreciate the content of each of the test items, and thus the details will be omitted here.

The testing-control apparatus 120 may be a personal computer or a server configured to control the combination and order of different test items performed by the test equipment 110 on the DUTs 130.

The testing-control apparatus 120 includes a processing unit 121, a memory unit 122, and a storage device 123. The storage device 123 may be a non-volatile memory such as a hard disk drive, a solid-state disk, or a flash memory, but the invention is not limited thereto. The memory unit 122 may be a volatile memory such as a static random-access memory (SRAM) or a dynamic random-access memory (DRAM), but the invention is not limited thereto.

The storage device 123 stores a test-item library 124 and a test-item scheduling program 125. The test-item library 124 records a plurality of test items and their corresponding test patterns. The test-item scheduling program 125 may arrange the test items required in the next test program according to a determination result output by a test-program neural network.

The processing unit 121 may be a central processing unit (CPU) or a general-purpose processor, but the invention is not limited thereto.

For example, the test-item library 124 may record N test items and corresponding test patterns. The test program used by the testing system 100 may include M test items to be performed on the DUT 130, where M and N are positive integers, and M is smaller than or equal to N. The processing unit 121 may load the test-item scheduling program 125 stored in the storage device 123 to the memory unit 122 for execution to determine the combination of test items from the N test items recorded by test-item library 124, that is required for the test program in the next test iteration.

If the DUT 130 is a DRAM chip, during the manufacturing of each batch of the DUTs 130, the testing system 100 has to perform various tests on the DUTs 130 to determine whether the functionality and data error rate of the DUTs 130 are normal. However, it usually costs a lot of time and money to perform each of the test items in a test program. For example, the product features (e.g., I/O numbers, speed, voltage, etc.) and demands (e.g., for vehicle, industry, personal computer) of different DUTs may differ. In addition, there are various test stages in the test program, and thus the required number of test items can be calculated by multiplying the number of product features, demands, and test stages, resulting in a great number of test items.

In response to completion of each test program, the test-item scheduling program 125 may automatically determine which test items should be used, and in which order, by the test program in the next iteration according to the test results generated by the current test program, thereby obtaining a more efficient test program having a shorter testing time and a higher test coverage.

Specifically, when the testing-control apparatus 120 performs different test items of a test program (e.g., an initial test program) on the DUT 130 for the first time, the test items in the initial test program can be defined according to a potential failure model of the DUT 130 and design experiences, or automatically defined by the testing-control apparatus 120. When each of the test items in the initial test program has been performed, the testing-control apparatus 120 may obtain a test result corresponding to each test item, such as a failure-bit map. Then, the testing-control apparatus 120 may input the test result of each test item to a test-program neural network, and the test-program neural network may learn from the test result of each test item to generate the combination of test items of the test program in the next test iteration. Depending on the result of learning, the combination of test items of the test program in the next test iteration may be the same as or different than the combination of test items of the current test program.

As the number of test programs that have been performed increases, the test-program neural network executed by the testing-control apparatus 120 may gradually find the most appropriate combination of test items, and thus the test coverage of the DUT 130 can be increased, and the testing time may also be reduced due to the best fit of the combination of test items and the reduced number of failure models (e.g., being smaller with a more mature manufacturing process). In addition, if a new failure model is generated due to simplification of the manufacturing process or a manufacturing process excursion, the testing system 100 of the present invention may adjust the test items in real-time to assure test quality, and may achieve the effect of gradually increasing the test quality and reducing the cost of testing.

Figure 2:
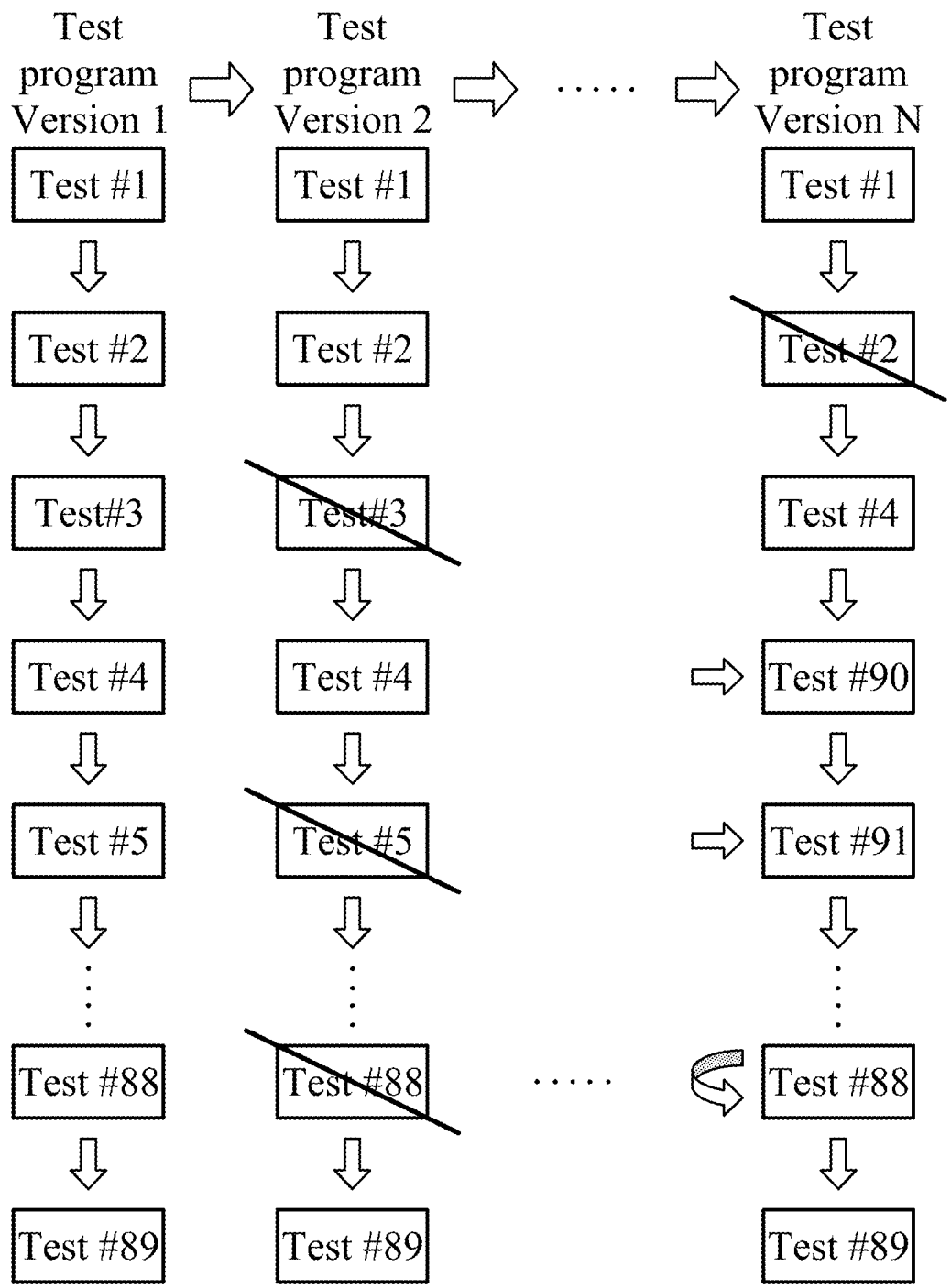
FIG. 2 is a diagram of a conventional modification method of a test program.

FIG. 2 is a diagram of a conventional modification method of a test program. As depicted in FIG. 2, version 1 of the test program (i.e., the first test iteration) includes a plurality of test items such as tests #1~#89. Conventionally, after the tests in the test program have been executed, the test results have to be manually inspected to select the test items that should be removed from or added to version 1 of the test program (i.e., subjective determination by manual inspection), such as removing test #3, test #5, and test #88, thereby generating version 2 of the test program (i.e., the second test iteration). After the test program of each test iteration has been performed, manual inspection of the test results of the test program is required to select the test items to be added or removed. For example, version N of the test program (i.e., the N-th test iteration) includes test items of test #1, test #2, test #4, test #90, test #91, . . . , test #88, and test #89, wherein test #90 and test #91 are newly added in version N of the test program, and test #88 is a recovered test item in version N of the test program.

Since there are many test items in the test program, it not only takes much time by manual inspection of the test results to select the test items to be added or removed, but also being unable of precisely selecting test items capable of increasing the test coverage.

Figure 3:
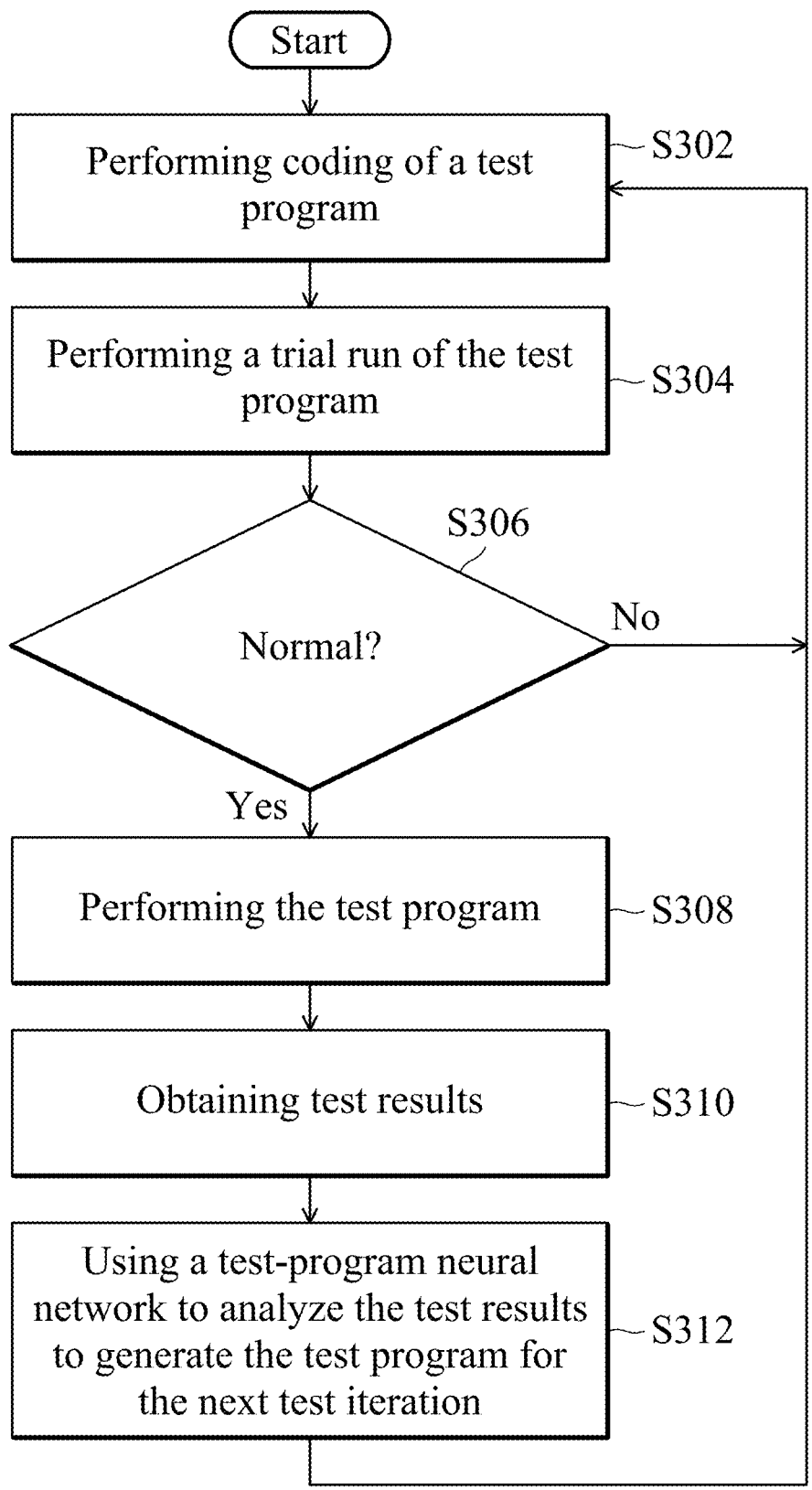
FIG. 3 is a diagram of an adaptive method of generating a test program in accordance with an embodiment of the invention.

FIG. 3 is a diagram of an adaptive method of generating a test program in accordance with an embodiment of the invention. In an embodiment, the testing-control apparatus 120 may execute the adaptive method of generating the test program in FIG. 3 to generate the test program.

In step S302, coding of a test program is performed. For example, when the testing-control apparatus 120 executes the initial test program to perform different test items on the DUT 130, the test items in the initial test program can be defined according to a potential failure model of the DUT 130 and design experiences, or automatically defined by the testing-control apparatus 120. Subsequently, test-program coding is performed, so that the test equipment 110 may correctly perform each of the test items in the test program.

In step S304, a trial run of the test program is performed. When the coding of the test program has completed, a trial run can be performed on the testing system 100, such as performing several initial test items or relatively important test items in the test program.

In step S306, it is determined whether the trial run is normal. If the trial run is normal, step S308 is performed. If the trial run is not normal, the procedure goes back to step S302 to perform coding of the test program again. In some embodiments, steps S304 and S306 can be omitted, and step S308 can be performed after step S302.

In step S308, the test program is performed. In step S308, the test program is formally executed, and each of the test items in the test program will be performed to generate a corresponding test result such as a failure-bit map. The test results may also include test yields or data logs, but the invention is not limited thereto.

In step S310, test results are obtained. For example, the test results obtained by the testing-control apparatus 120 may include the test results of the test items in the trial run (if performed) and the formal run of the test program.

In step S312, a test-program neural network is used to analyze the test results to generate the test program for the next test iteration. For example, the testing-control apparatus 120 may input the test result of each test item into a test-program neural network, and the test-program neural network may analyze and learn the importance of each test item in the current test program to determine the test items to be removed from or added to the test items in the current test program, thereby determining the combination of test items of the test program in the next test iteration. Then, step S302 is performed. The details of the test-program neural network will be described later.

FIGS. 4A~4D are diagrams of failure-bit maps of different test items in accordance with an embodiment of the invention. In an embodiment, if the test program includes test items #1~#4, and the test results of the test items #1~#4 can be expressed by the failure-bit maps 410~440, as respectively illustrated in FIGS. 4A~4D.

In some embodiments, if the DUT 130 is a DRAM chip, the test items #1~#4 may be performed on the DUT 130 (e.g., includes 7×7 bits). That is, in FIGS. 4A~4D, the black-labeled blocks may indicate failure or error of the corresponding data bit in the DUT 130.

Figure 4A:
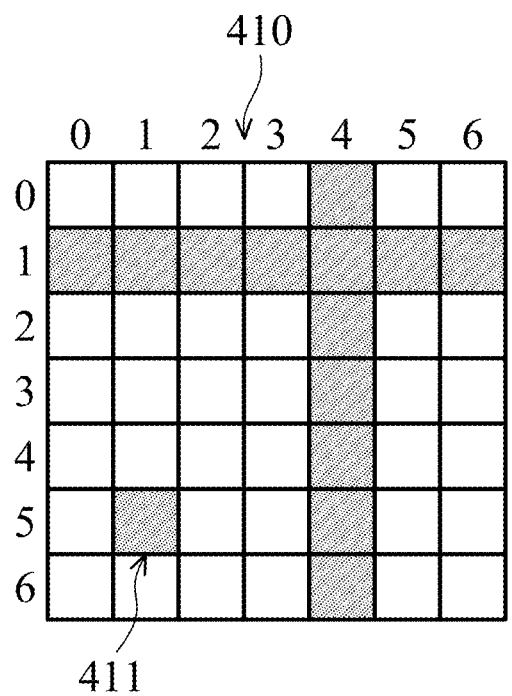
FIGS. 4A~4D are diagrams of failure-bit maps of different test items in accordance with an embodiment of the invention.

As depicted in FIG. 4A, the test item #1 has failure bits on bits (4,0)~(4,6), bits (0,1)~(6,1), and bit (1,5) of the DUT 130, that are labeled on the failure-bit map 410, wherein the bit (1,5) in FIG. 4A can be regarded as a unique failure bit 411.

Figure 4B:
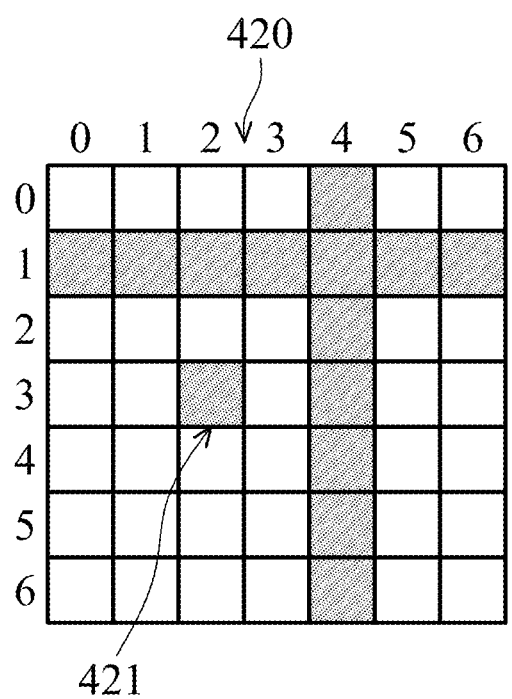

As depicted in FIG. 4B, the test item #2 has failure bits on bits (4,0)~(4,6), bits (0,1)~(6,1), and bit (2,3) of the DUT 130, that are labeled on the failure-bit map 420, wherein the bit (2,3) in FIG. 4B can be regarded as a unique failure bit 421.

Figure 4C:
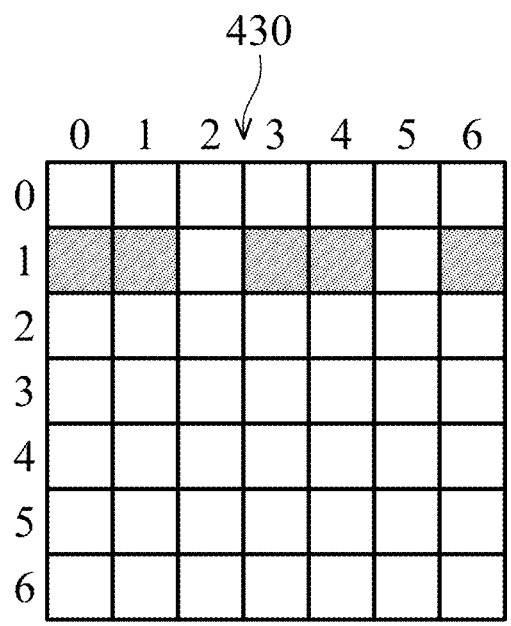

As depicted in FIG. 4C, the test item #3 has failure bits on bit (0,1), bit (1,1), bit (3,1), bit (4,1), and bit (6,1) of the DUT 130, that are labeled on the failure-bit map 430.

Figure 4D:
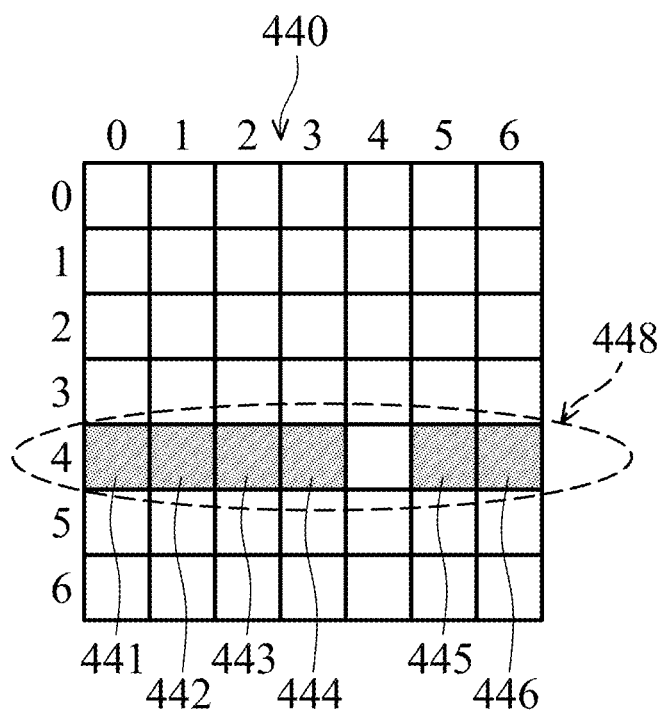

As depicted in FIG. 4D, the test item #4 has failure bits on bits (0,4)~(3,4), bits (5,4)~(6,4) of the DUT 130, that are labeled on the failure-bit map 440. The bits (0,4)~(3,4) and bits (5,4)~(6,4) in range 448 of FIG. 4D can be regarded as unique failure bits 441~446.

In an embodiment, the testing-control apparatus 120 may compare the failure-bit map of each test item. If a particular bit in the failure-bit map of a particular test item is a unique failure bit, it indicates that the unique failure bit does not exist in other failure-bit maps of other test items, such as the unique failure bit 411 in FIG. 4A, the unique failure bit 421 in FIG. 4B, and unique failure bits 441~446 in FIG. 4D.

For example, the failure bits such as bits (4,0)~(4,6) and bits (0,1)~(6,1) in FIG. 4B also exist in the failure-bit map 410 in FIG. 4A, but the failure-bit map 410 in FIG. 4A does not include the unique failure bit 421 in the failure-bit map 420 in FIG. 4B.

Similarly, the failure bits such as bit (0,1), bit (1,1), bit (3,1), bit (4,1), and bit (6,1) in the failure-bit map 430 in FIG. 4C have been covered by the failure-bit map 410 in FIG. 4A and the failure-bit map in FIG. 4B.

Specifically, when the failure-bit map of a particular test item has one or more unique failure bits, the testing-control apparatus 120 may designate the particular test item as an essential test item. In the embodiment, since the failure-bit maps 410, 420, and 440 include unique failure bits, and thus the test items #1, #2, and #4 are essential test items. Subsequently, the testing-control apparatus 120 may re-confirm the failure-bit maps of these essential test items may cover all of the failure bits. If the failure-bit maps of the essential test items do not cover all of the failure bits (e.g., first failure bits), the testing-control apparatus 120 may select the test item capable of covering the first failure bits as the essential test item. The essential test items will be included in the test program of the next test iteration.

In some other embodiments, the DUT 130 may be a semiconductor wafer, and the test items #1~#4 are performed on the semiconductor wafer (e.g., including 7×7 dies), and each die may be an integrated circuit. That is, the black-labeled blocks in FIGS. 4A~4D may indicate failure or errors of the corresponding dies in the semiconductor wafer. The details for processing other test items and unique failure bits are similar to those in the aforementioned embodiment.

Figure 5:
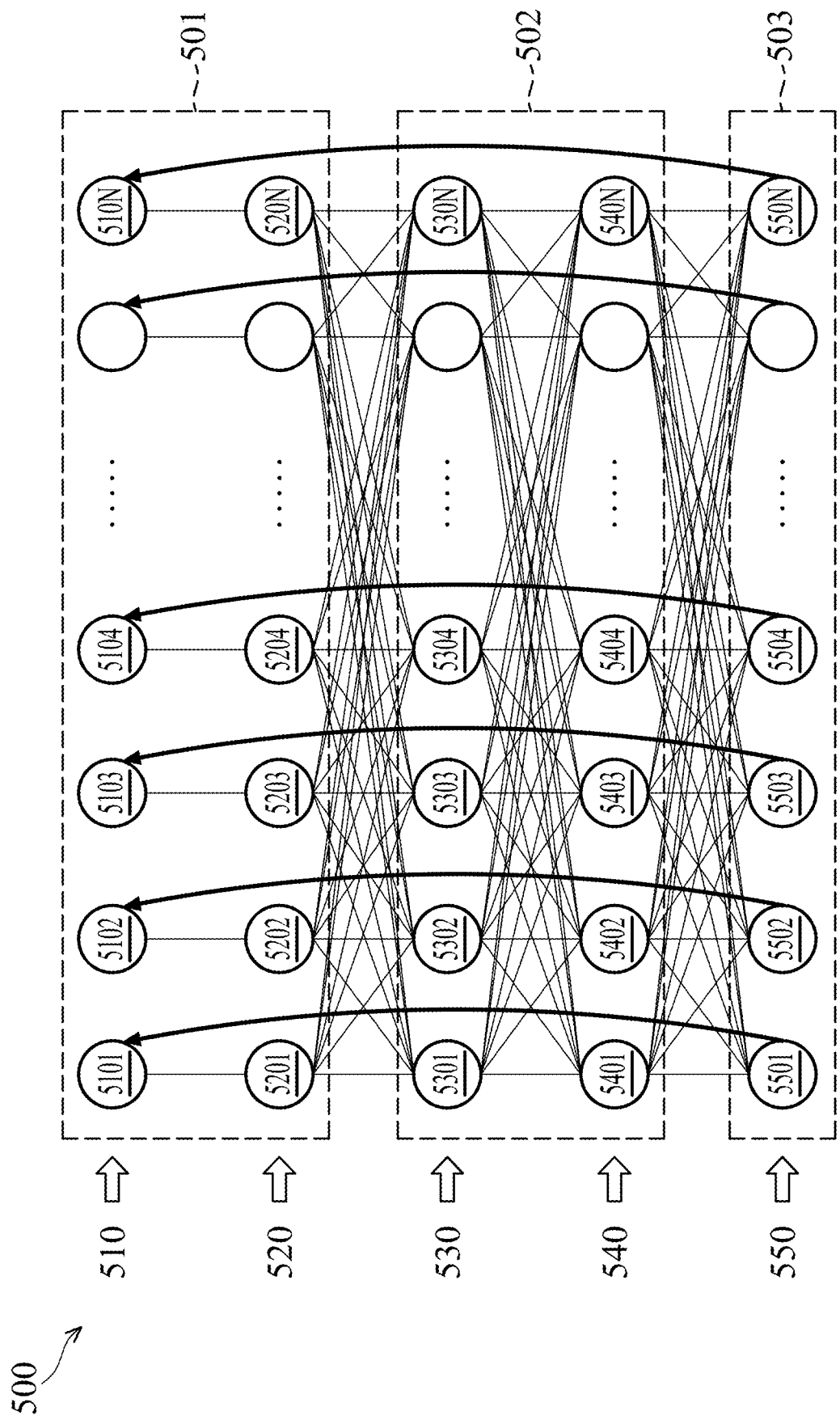
FIG. 5 is a diagram of the test-program neural network in accordance with an embodiment of the invention.

FIG. 5 is a diagram of the test-program neural network in accordance with an embodiment of the invention. As depicted in FIG. 5, the test-program neural network 500 may include a test-item layer 510, a failure-bit-map layer 520, an essential-test-item layer 530, a prioritized-weighting layer 540, and a next-test-item layer 550.

Specifically, each of the test items in the aforementioned embodiments, for example, are located in the test-item layer 510, and the failure-bit map generated by each of the test items is located in the failure-bit-map layer 520. The test-item layer 510 and the failure-bit-map layer 520 can be regarded as an input layer 501 of the test-program neural network 500. Each of the cells 5101-510N in the test-item layer 510 may record the number, testing time, and a test flag of a corresponding test item. The test flag is used for labeling whether the corresponding test item is one of the test items in the next test iteration, and the initial value of the test flag can be set by the user, and the value of the test flag can be obtained from the output layer 503 according to the learning result. Each of the cells 5201~520N in the failure-bit-map layer 520 may record the failure-bit map generated by each test item of the DUT 130.

The essential-test-item layer 530 and the prioritized-weighting layer 540 can be regarded as a processing layer 502 of the test-program neural network 500. Each of the cells 5301~530N in the essential-test-item layer 530 can be used to analyze the test items of the current test program to generate the effective test items in the current test program, such as using the method described in the embodiments in FIGS. 4A~4D. If the failure-bit map of a particular test item has one or more unique failure bits that do not exist in other test items, the testing-control apparatus 120 may designate the particular test item as an essential test item. Subsequently, the testing-control apparatus 120 may re-confirm the failure-bit maps of these essential test items may cover all of the failure bits. If the failure-bit maps of the essential test items do not cover all of the failure bits (e.g., first failure bits), the testing-control apparatus 120 may designate the test item capable of covering the first failure bits as the essential test item.

Each of the cells 5401~540N in the prioritized-weighting layer 540 is used to accumulate and update the weighting value of each test item. For example, the weighting value of each test item can be calculated using equation (1):

$$Wi(n)=[Wi(n-1)*(n-1)+A]/n \quad (1)$$

where Wi(n) denotes the i-th test item in the n-th test iteration; A is a constant. If the test item is an essential test item, A is equal to 1. If the test item is not an essential item, A is equal to 0. With regard to the unselected test items in the current test iteration, A is equal to 0.001. It should be noted that the value of the constant A can be determined according to practical conditions, and the aforementioned values of the constant A is for description, but the invention is not limited thereto.

Specifically, the prioritized-weighting layer 540 may add more weighting value to the essential test items according to the test results of the current test iteration. The weighting values of the test items that are not essential test items and performed in the current test iteration will decrease. The weighting values of the candidate test items that are not selected in the current test iteration will gradually increase with a slow speed, so that the candidate test items may replace unimportant test items after various test iterations. That is, the combination of test items can be optimized after repeated learning of the test results of each test iteration.

The next-test-item layer 550 can be regarded as an output layer 503 of the test-program neural network 500. Each of the cells 5501~550N of the next-test-item layer 550 is used to determine the combination of test items of the test program in the next test iteration. Each of the test items may have a respective weighting value and testing time (e.g., cells 5501~550N) after deep learning of the test-program neural network 500 on the test results of each test iteration. The test items in the next test iteration can be determined according to the condition set by the user (e.g., test-time-based condition or test-coverage-based condition). The test-time-based condition may indicate that the most important test items (e.g., based on the prioritized weighting value of each test item) have to be performed within a limited test-time budget. If the total test time of the selected test items exceeds the test-time budget, the less important test items will be discarded. The test-coverage-based condition may indicate that the combination of test items has to reach predetermined test coverage.

In an embodiment, using the test-time-based condition as an example, the prioritized weighting value PW of each test item can be calculated using equation (2):

$$PWi(n)=Wi(n)/Ti \qquad (2)$$

where PWi(n) denotes the prioritized weighing value of the i-th test item in the n-th test iteration; Wi(n) denotes the weighting value of the i-th test item in the n-th test iteration; and Ti denotes the testing time of the i-th test item.

Given that N(total) denotes the test-time budget set by the user, the prioritized weighting value of each test item is ranked in a descending order. For example, the i-th test item in the current test iteration has the largest prioritized weighting value PWi, and the j-th test item has the second largest prioritized weighting value PWj, and the k-th test item has the third largest prioritized weighting value PWk. That is, the test time Ti, Tj, and Tk of the i-th, j-th, and k-th test items can be calculated as Wi/PWi, Wj/PWj, and Wk/PWk, respectively. Subsequently, the next-test-item layer 550 may calculate whether the total test time of the test times Ti, Tj, and Tk exceeds the test-time budget N(total). If the total test time does not exceed the test-time budget N(total), the test item having the fourth largest prioritized weighting value can be selected. Then, the new total test time of the four selected test items is calculated, and it is determined whether the new total test time exceeds the test-time budget N(total). If the new total test time does not exceed the test-time budget N(total), it indicates that the test item having the fourth largest prioritized weighting value can be selected as one of the test items in the next test iteration. The above-mentioned method can be repeatedly performed to determine whether it is appropriate to select the following test items as one of the test items in the next test iteration. It should be noted that, when the i-th, j-th, and k-th test items are selected as the test items in the next test iteration, it indicates that the i-th, j-th, and k-th test items will be fed back to the test-item layer 510 being ready for the next test iteration.

Conversely, if the new total test time exceeds the test-time budget N(total) after adding the test time of a particular test item into the total test time, it indicates that the particular test item cannot be selected as one of the test items in the next test iteration in the test-time-based condition.

In another embodiment, using the test-coverage-based (or test-quality-based) condition as an example, each item has a test-coverage failure rate PPM, and the test-coverage failure rate PPM can be expressed in units of defective parts per million (DPPM). According to the calculated prioritized weighting value of each test item, if there are n test items in the current test iteration, the prioritized weighting value of the n test items can be ranked in ascending order from $PW_n$, $PW_{n-1}$, ..., $PW_1$. In the embodiment, PPMn denotes the test-coverage failure rate of the test item having the least prioritized weighting value, and PPMn-1 denotes the test-coverage failure rate of the testing item having the second least prioritized weighting value, and so on.

In addition, the testing-control apparatus 120 may set a maximum tolerable-test-coverage failure rate PPM(total) which can be expressed by DPPMs. The maximum tolerable-test-coverage failure rate PPM(total) should satisfy the following equation:

$$PPM(total)=\Sigma(PPM_n+PPM_{n-1}+PPM_{n-2}+ \ldots PPM_{n-i}) \qquad (3)$$

wherein (n-i) denotes the last test item having the prioritized weighting value PWn-i and the test-coverage failure rate PPMn-I that satisfies equation (3). Specifically, a test item having a smaller prioritized weighting value usually has a lower test-coverage failure rate. For example, in a mature manufacturing process, failure bits of certain test items become very rare. Afterwards, the testing-control apparatus 120 may filter out the test items # n~# n-i, and select the remaining test items # n-i-1~#1 to be fed back to the test-item layer 510 for the next test iteration.

It should be noted that if the next-test-item layer 550 determines that a portion of the test items should be fed back to the test-item layer 510, it indicates that the portion of the test items is included in the test program in the next test iteration. If the next-test-item layer 550 determines that a portion of the test items should not be fed back to the test-item layer 510, it indicates that the portion of the test items is not included in the test program in the next test iteration.

Accordingly, the test-program neural network in the present invention may objectively learn from the test results (e.g., failure-bit maps) of the test items in the test program in each test iteration and the condition (e.g., test-time-based condition or test-coverage-based condition) used to determine the combination of test items in the test program in the next test iteration.

Figure 6:
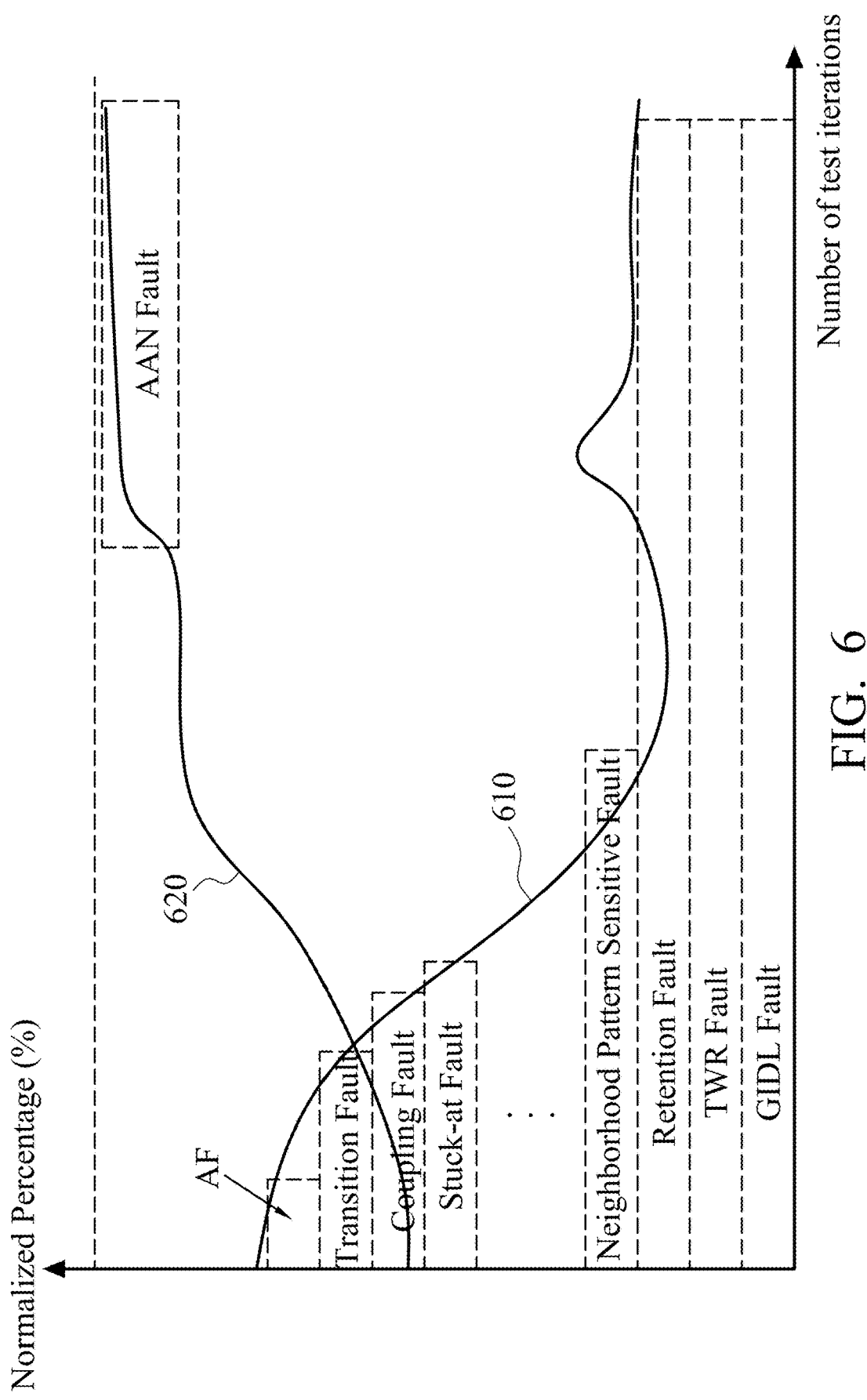
FIG. 6 is a diagram of the relationships between the test-coverage rate, test time, and the number of test iterations in accordance with an embodiment of the invention.

FIG. 6 is a diagram of the relationships between the test-coverage rate, test time, and number of test iterations in accordance with an embodiment of the invention. As depicted in FIG. 6, the vertical axis indicates the normalized percentage, and the horizontal axis indicates the number of test iterations. Curve 610 indicates the relationship between the test time and the number of test iterations, and curve 620 indicates the relationship between the test-coverage rate and the number of test iterations.

Specifically, as the number of test iterations increases, the test time required by the test program may gradually decrease (e.g., curve 610). As the number of test iterations for the test program increases, the test-program neural network executed by the testing-control apparatus 120 may gradually find the most appropriate combination of test items for the DUT 130 (or the semiconductor wafer). Thus, the test coverage rate can be increased (e.g., curve 620), and the test time may be reduced due to the most appropriate combination of test items and decrement of the failure models.

In addition, if a new failure model is generated due to simplification of the manufacturing process or a manufacturing process excursion, the testing system 100 of the present invention may adjust the test items in real-time to assure the test quality. For example, the prioritized weighting value of the new failure model can be directly set and provided to the test-program neural network 500 for learning. Alternatively or additionally, the test-program neural network 500 may automatically learn from the test results after each test iteration is completed as the number of test iterations increases. Accordingly, the testing system 100 in the present invention may achieve the effect of gradually improving the test quality and lowering the test costs.

In view of the above, a testing system and an adaptive method of generating a test program are provided in the present invention. The testing system and the adaptive method are capable of objectively adjusting the test conditions and test patterns in real-time by the test program according to the situations of the DUT. Thus, the test quality and cost can be maintained at a default expected value, and the errors and waste of resources (e.g., manual analysis, trial runs, etc.) caused by manual inspection of the test results between revisions of the test programs can be reduced.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

The methods, or certain aspects or portions thereof, may take the form of a program code embodied in tangible media, such as floppy diskettes, CD-ROMs, hard drives, or any other machine-readable (e.g., computer-readable) storage medium, or computer program products without limitation in external shape or form thereof, wherein, when the program code is loaded into and executed by a machine such as a computer, the machine thereby becomes an apparatus for practicing the methods. The methods may also be embodied in the form of program code transmitted over some transmission medium, such as an electrical wire or a cable, or through fiber optics, or via any other form of transmission, wherein, when the program code is received and loaded into and executed by a machine such as a computer, the machine becomes an apparatus for practicing the disclosed methods. When implemented on a general-purpose processor, the program code combines with the processor to provide a unique apparatus that operates analogously to application specific logic circuits.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A testing system, comprising:
   test equipment; and
   a testing-control apparatus, configured to execute a test program to control the test equipment to perform tests, that correspond to a plurality of first test items in the test program, on a device under test,
   wherein the testing-control apparatus retrieves a test result of each of the first test items from the test equipment, and executes a test-program neural network to analyze the test result of each of the first test items to generate the test program for a next test iteration.

2. The testing system as claimed in claim 1, wherein the testing-control apparatus comprises a test-item library for storing a plurality of second test items and corresponding test patterns, and the testing-control apparatus determines the plurality of first test items from the plurality of second test items.

3. The testing system as claimed in claim 2, wherein the test result of each of the first test items indicates a failure-bit map of the device under test.

4. The testing system as claimed in claim 3, wherein the device under test is a memory chip, and the failure-bit map generated by each of the first test items indicates data bits having errors or being damaged in the memory chip.

5. The testing system as claimed in claim 3, wherein the device under test is a semiconductor wafer, and the failure-bit map generated by each of the first test items indicates data bits having errors or being damaged in the semiconductor wafer.

6. The testing system as claimed in claim 3, wherein the testing-control apparatus compares the failure-bit map of each of the first test items to determine whether each failure-bit map comprises one or more unique failure bits, and designates one of the first test items having the one or more unique failure bits as an essential test item,
   wherein the test program in the next test iteration comprises the essential test item.

7. The testing system as claimed in claim 6, wherein the testing-control apparatus calculates a weighting value for each of the first test items according to whether each of the first test items is the essential test item.

8. The testing system as claimed in claim 7, wherein each of the first test items has a test time, and the testing-control apparatus calculates a prioritized weighting value for each of the first test items according to the weighting value and the test time of each of the first test items.

9. The testing system as claimed in claim 8, wherein the testing-control apparatus ranks the prioritized weighting value of each of the first test items, sets a test-time budget, and determines the first test items in the test program in the next test iteration according to the ranked prioritized weighting value and the test-time budget.

10. The testing system as claimed in claim 8, wherein each of the first test items has a test-coverage failure rate, and the testing-control apparatus ranks the prioritized weighting value of each of the first test items, sets a maximum tolerable test-coverage failure rate, and determines the first test items in the test program in the next test iteration according to the ranked prioritized weighting value and the maximum tolerable test-coverage failure rate.

11. An adaptive method of generating a test program, for use in a testing system, wherein the testing system comprises test equipment, the adaptive method comprising:
    executing a test program to control the test equipment to perform tests, that correspond to a plurality of first test items in the test program, on a device under test;
    retrieving a test result of each of the first test items from the test equipment; and
    executing a test-program neural network to analyze the test result of each of the first test items to generate the test program for a next test iteration.

12. The adaptive method as claimed in claim 11, wherein the testing system comprises a test-item library for storing a plurality of second test items and corresponding test patterns, and the adaptive method further comprises:
    determining the plurality of first test items from the plurality of second test items.

13. The adaptive method as claimed in claim 12, wherein the test result of each of the first test items indicates a failure-bit map of the device under test.

14. The adaptive method as claimed in claim 13, wherein the device under test is a memory chip, and the failure-bit map generated by each of the first test items indicates data bits having errors or being damaged in the memory chip.

15. The adaptive method as claimed in claim 13, wherein the device under test is a semiconductor wafer, and the failure-bit map generated by each of the first test items indicates data bits having errors or being damaged in the semiconductor wafer.

16. The adaptive method as claimed in claim 13, further comprising:
    comparing the failure-bit map of each of the first test items to determine whether each failure-bit map comprises one or more unique failure bits; and
    designating one of the first test items having the one or more unique failure bits as an essential test item,
    wherein the test program in the next test iteration comprises the essential test item.

17. The adaptive method as claimed in claim 16, further comprising:
    calculating a weighting value of each of the first test items according to whether each of the first test items is the essential test item.

18. The adaptive method as claimed in claim 17, wherein each of the first test items has a test time, and the adaptive method further comprises:
    calculating a prioritized weighting value of each of the first test items according to the weighting value and the test time of each of the first test items.

19. The adaptive method as claimed in claim 18, further comprising:
    ranking the prioritized weighting value of each of the first test items;
    setting a test-time budget; and
    determining the first test items in the test program in the next test iteration according to the ranked prioritized weighting value and the test-time budget.

20. The adaptive method as claimed in claim 18, wherein each of the first test items has a test-coverage failure rate, and the adaptive method further comprises:
    ranking the prioritized weighting value of each of the first test items;
    setting a maximum tolerable test-coverage failure rate; and
    determining the first test items in the test program in the next test iteration according to the ranked prioritized weighting value and the maximum tolerable test-coverage failure rate.

* * * * *